(12) United States Patent
Ahn

(10) Patent No.: US 7,638,389 B2
(45) Date of Patent: Dec. 29, 2009

(54) SEMICONDUCTOR DEVICE CAPACITOR FABRICATION METHOD

(75) Inventor: Jung-Ho Ahn, Chungcheongbuk-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/957,982

(22) Filed: Dec. 17, 2007

(65) Prior Publication Data
US 2008/0157158 A1    Jul. 3, 2008

(30) Foreign Application Priority Data
Dec. 28, 2006    (KR) .............. 10-2006-0135904

(51) Int. Cl.
*H01L 21/8242* (2006.01)
(52) U.S. Cl. ............ 438/239; 438/236; 438/253; 257/306; 257/E21.646
(58) Field of Classification Search ............ 438/236, 438/239, 253; 257/306, E27.084, E21.646
See application file for complete search history.

(56) References Cited

U.S. PATENT DOCUMENTS 6,444,554 B1 * 9/2002 Adachi et al. ............ 438/587
6,699,726 B2 * 3/2004 Hidaka et al. ............ 438/3

FOREIGN PATENT DOCUMENTS

| KR | 10-2002-81798 | 10/2002 |
| KR | 10-2004-41253 | 5/2004 |

* cited by examiner

*Primary Examiner*—Phuc T Dang
(74) *Attorney, Agent, or Firm*—Sherr & Vaughn, PLLC

(57) ABSTRACT

A semiconductor device capacitor fabrication method that is capable of enabling the simultaneous use of an oxide capacitor and a PIP capacitor of a semiconductor device depending upon whether metal line terminals are used. The semiconductor device capacitor fabrication method can include forming an active region and a first gate electrode over a semiconductor substrate, partially depositing a silicon nitride layer, over which a capacitor will be formed, over the first gate electrode, forming a second gate electrode over the silicon nitride, sequentially forming a first insulation layer and a second insulation layer over the resultant structure and forming line terminals extending through the first insulating layer and the second insulating layer for a transistor and a capacitor.

17 Claims, 8 Drawing Sheets

(RELATED ART)

SiN capacitor

Oxide capacitor

SiN & Oxide capacitor

SEMICONDUCTOR DEVICE CAPACITOR FABRICATION METHOD

The present application claims priority under 35 U.S.C. 119 to Korean Patent Application No. 10-2006-0135904 (filed on Dec. 28, 2006), which is hereby incorporated by reference in its entirety.

BACKGROUND

Aspects of semiconductor technology have focused on providing a semiconductor device capable of embodying a high-capacitance capacitor in a logic circuit requiring a high-speed operation.

The high-capacitance capacitor may be classified as a metal-insulator-metal (MIM) capacitor or a polysilicon-insulator-polysilicon (PIP) capacitor. Unlike a metal oxide silicon (MOS) capacitor or a junction capacitor, MIM capacitors and PIP capacitors are bias independent, and therefore, requires accuracy.

Specifically, the MIM capacitor may be fabricated simultaneously with the formation of metal lines during a semiconductor process. Consequently, an additional metal process may be required after the fabrication of the semiconductor device. On the other hand, the PIP capacitor may be fabricated on and/or over a shallow trench isolation (STI) layer, with the result that an additional process is not required unlike the MIM capacitor. Also, the PIP capacitor may be widely used for noise prevention and frequency modulation of an analog device. Moreover, a bottom electrode and a top electrode of the PIP capacitor may be composed of the same material such as polysilicon, as a gate electrode material of a logic transistor. Consequently, the electrodes of the PIP capacitor are fabricated simultaneously with the fabrication of a gate electrode without the provision of an additional process.

Figure 1A:
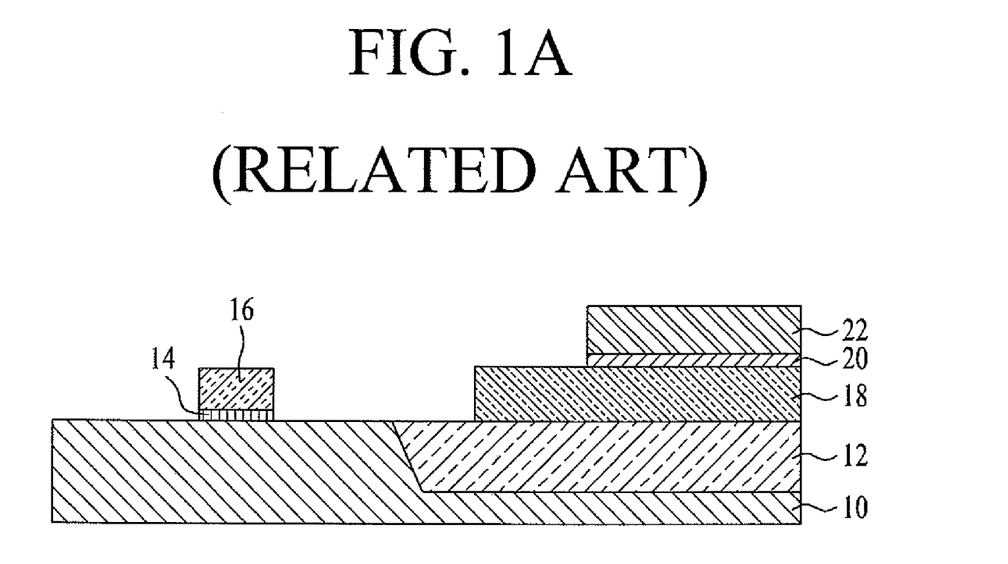
FIGS. 1A to 1G illustrate a method of fabricating a polysilicon-insulator-polysilicon (PIP) capacitor in a semiconductor device.

As illustrated in example FIG. 1A, a method of fabricating a PIP capacitor in a semiconductor device may include forming shallow trench isolation (STI) layer 12 on and/or over silicon semiconductor substrate 10 through an isolation process. Accordingly, semiconductor substrate 10 is divided into an active area and an isolation area. The active area may then be ion-implanted with a dopant, which is necessary for controlling a threshold voltage, through an ion implantation process.

An insulation layer may then be deposited on and/or over the entire surface of the active area of semiconductor substrate 10. A first polysilicon layer, which may be used as a gate electrode of a logic transistor and a bottom electrode of a PIP capacitor, may then be deposited on and/or over the insulation layer. A photolithographic and dry etching process using a mask for bottom electrode 18 of the capacitor may then be carried out to pattern the first polysilicone layer such that bottom electrode 18 of the capacitor is formed on and/or over STI layer 12. An ion implantation process may then be carried out to increase the dopant concentration of bottom electrode 18.

An oxide-nitride-oxide (ONO) layer, as dielectric layer 20, may then be deposited on and/or over the entire surface of the structure. A second polysilicone layer, which will be used as a top electrode of the PIP capacitor, may then be deposited and ion-implanted on and/or over the ONO layer. Photolithographic and dry etching processes using masks for the gate electrode of the logic transistor and the top electrode of the capacitor may then be carried out to pattern the second polysilicone layer, located on and/or over STI layer 12 to form top electrode 22 of the capacitor on and/or over dielectric layer 20 and also pattern dielectric layer 20 located below top electrode 22. At the same time, the second polysilicone layer may be patterned on the active area of semiconductor substrate 10 to form gate electrode 16 of the logic transistor. The insulation layer, provided below gate electrode 16, may also be patterned to form gate insulation layer 14.

Subsequently, a lightly doped drain (LDD) ion implantation process is carried out on the active area of the logic transistor to form n-type LDD or p-type LDD regions in semiconductor substrate 10. The n-type LDD or p-type LDD regions may be spaced apart from each other by the width of gate electrode 16.

Figure 1B:
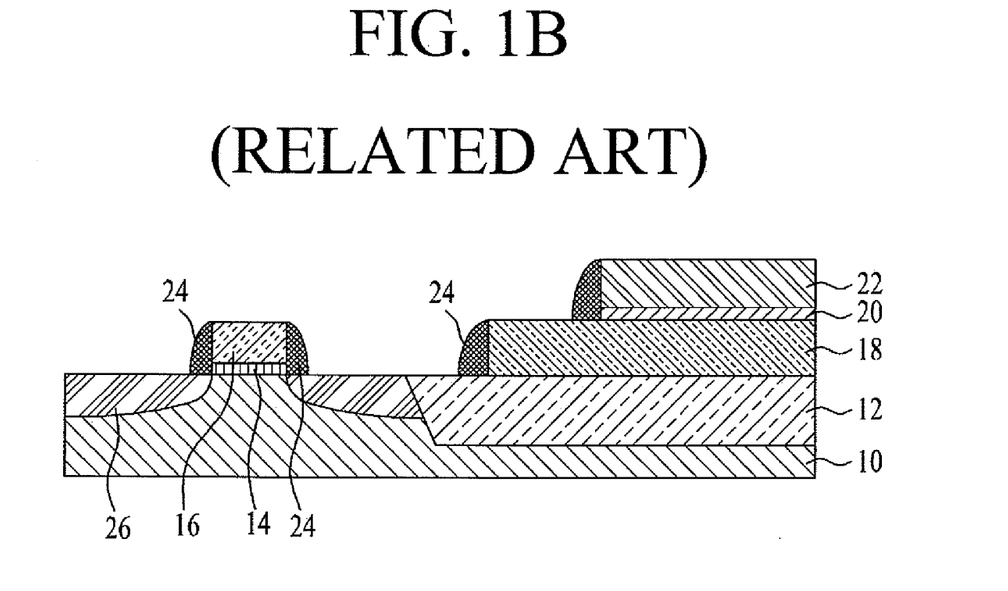

As illustrated in example FIG. 1B, an insulation layer composed of silicon nitride ($Si_3N_4$) may then be deposited on and/or over the entire surface of the structure. The silicon nitride layer may then be dry-etched to form spacers 24 at opposite sidewalls of top electrode 22, dielectric layer 20 and bottom electrode 18 of the capacitor. Spacers 24 may also be formed at opposite sidewalls of gate insulation layer 14 and gate electrode 16 of the logic transistor. Subsequently, a source/drain ion implantation process may then be carried out on the logic transistor area to form source/drain areas 26 in semiconductor substrate 10. Source/drain areas 26 may be spaced apart from each other by the width of gate electrode 16 and spacers 24.

Figure 1C:
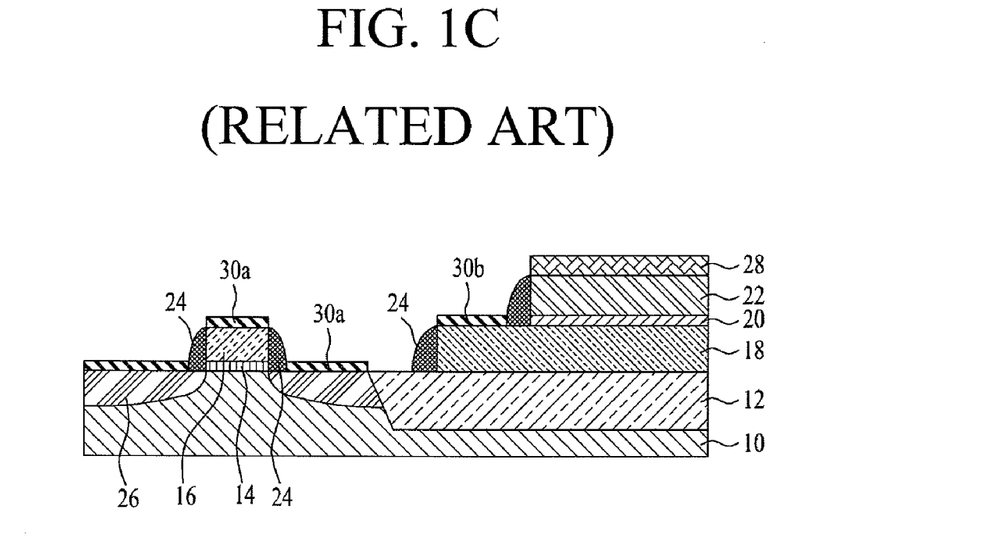

As illustrated in example FIG. 1C, blocking oxide layer 28 may then be formed on and/or over the surface of top electrode 22 of the capacitor or a position of the logic transistor area where a silicide metal layer will not be formed. Subsequently, a silicide metal layer composed of titanium (Ti) may then be deposited on and/or over the entire surface of semiconductor substrate 10. The titanium layer may then be annealed to form first titanium silicide layer 30a and second titanium silicide layer 30b. Specifically, first titanium silicide layer 30a may be formed on and/or over the surface of gate electrode 16 or source/drain area 26 of the logic transistor. Second titanium silicide layer 30b may be formed on and/or over the surface of bottom electrode 18 of the capacitor.

Figure 1D:
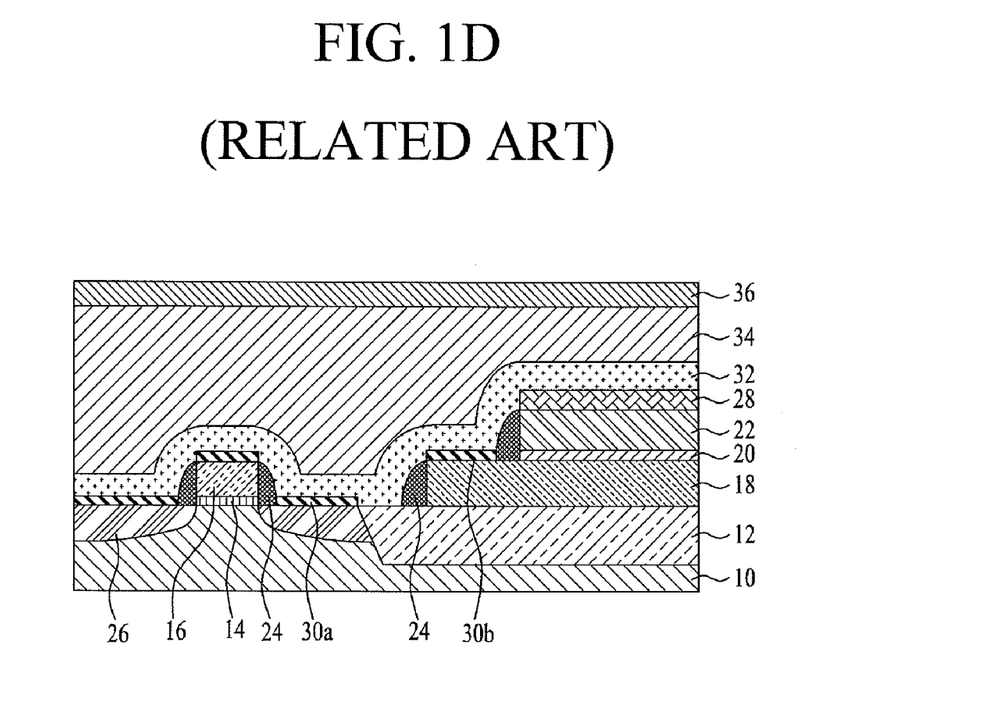

As illustrated in example FIG. 1D, etching stop layer 32 composed of silicon nitride may then be formed on and/or over the entire surface of the structure. Poly metal dielectric (PMD) layer 34 composed of borophosphoric silicate glass (BPSG) or phospho silicate glass (PSG) may then be deposited and annealed on and/or over etching stop layer 32. Subsequently, a chemical mechanical polishing (CMP) process may then be carried out to planarize the surface of poly metal dielectric layer 34. Buffer oxide layer 36 may then be formed on and/or over poly metal dielectric layer 34 to compensate for scratches generated during the CMP process.

Figure 1E:
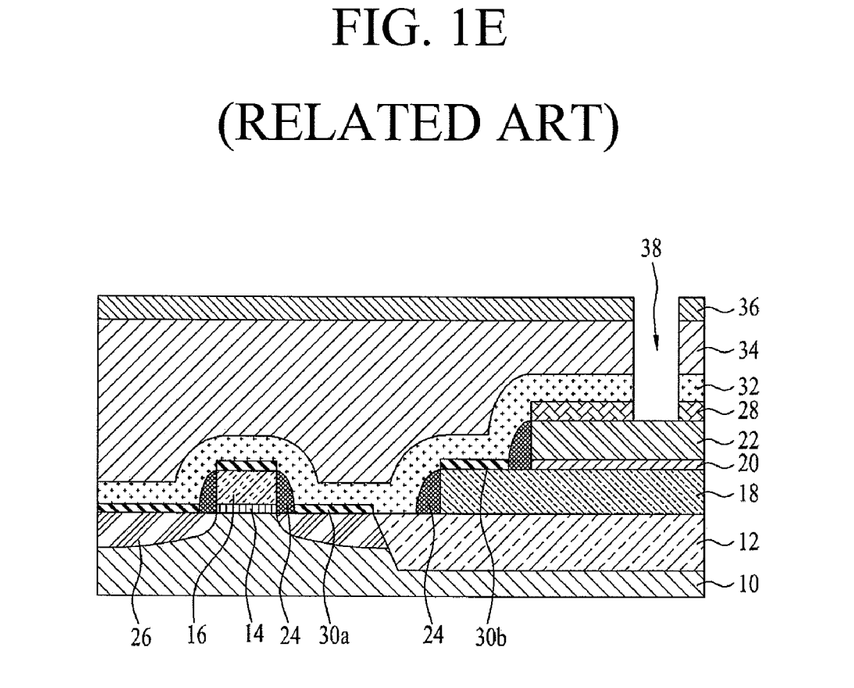

As illustrated in example FIG. 1E, a photolithographic process using a mask for a top electrode contact hole of the capacitor may then be carried out on buffer oxide layer 36 to form a photoresist pattern defining a contact hole area of the capacitor. Subsequently, buffer oxide layer 36 and blocking oxide layer 28, including the layers disposed therebetween, may then be etched through a dry etching process to form contact hole 38 to expose the uppermost surface of top electrode 22 of the capacitor. The photoresist pattern may then be removed.

Figure 1F:
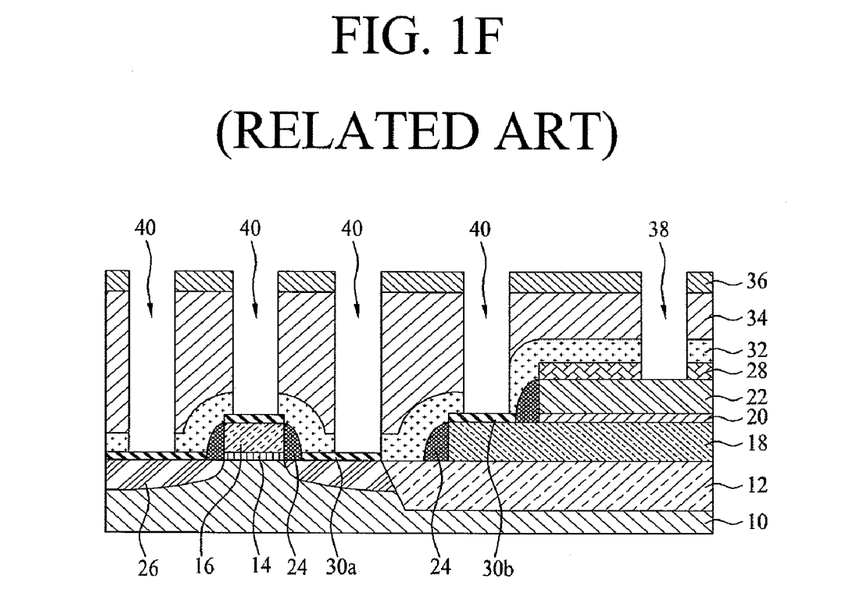

As illustrated in example FIG. 1F, a photolithographic process using a mask for bottom electrode contact holes of the capacitor and contact holes of the logic transistor may then be carried out on buffer oxide layer 36 to form a photoresist pattern defining a contact hole area of the logic transistor and a bottom electrode contact hole area of the capacitor. Subsequently, buffer oxide layer 36 and etching stop layer 32, including the layer disposed therebetween, may then be etched through a dry etching process to form contact holes 40 to expose the uppermost surface of gate electrode 16 of the logic transistor or the uppermost surface of first silicide layer 30a of source/drain area 26. At the same time, contact hole 40 may be formed to expose the uppermost surface of second silicide layer 30b of bottom electrode 18 of the capacitor.

Figure 1G:
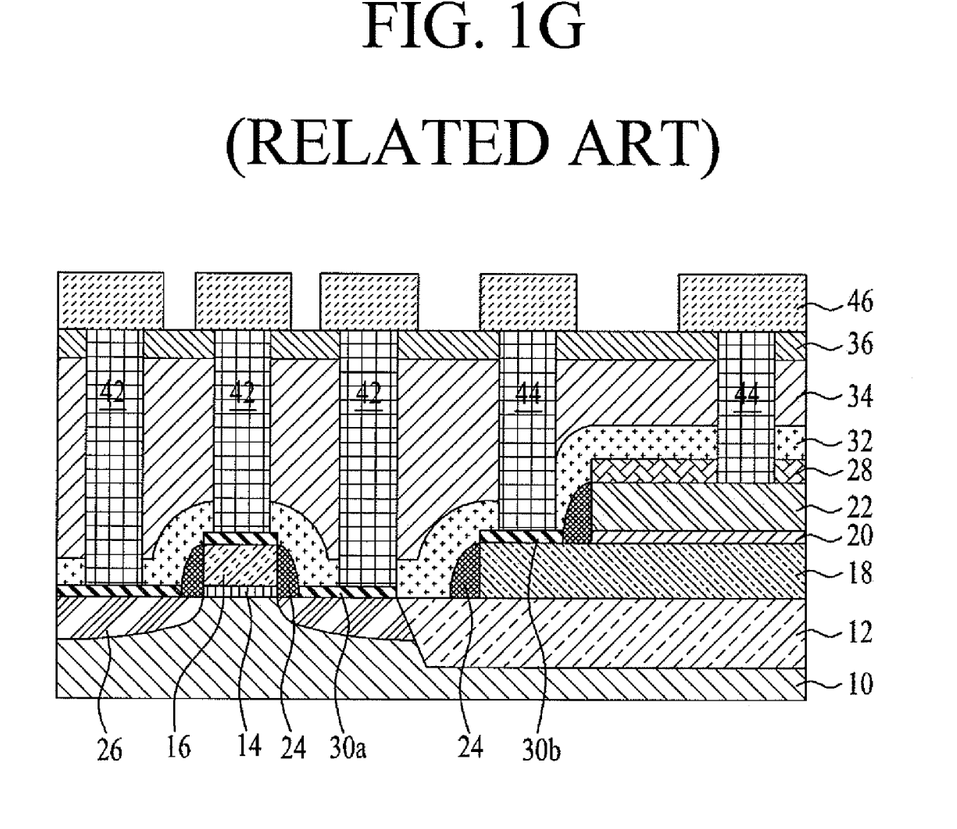

As illustrated in example FIG. 1G, contact holes 38 and contact holes 40, extending from buffer oxide layer 36 to etching stop layer 32, may then be filled with a conductive layer such as doped polysilicone or a metal material. The conductive layer may then be patterned to form contacts 42 electrically connected to gate electrode 16 of the transistor and source/drain area 26 and also contacts 44 electrically connected to bottom electrode 18 and top electrode 22 of the capacitor. Subsequently, line 46 may then be formed on and/or over buffer oxide layer 36 for connection to contacts 42 and contacts 44.

In accordance with the aforelisted method of fabricating a PIP capacitor in a semiconductor device, however, the PIP capacitor is constructed in a structure having two stacked polysilicon layers. Accordingly, the contact hole etching process must be carried out twice due to the difference in height between the logic transistor and the capacitor. This complicates the fabrication process and increases fabrication costs.

Furthermore, the oxide capacitor and the PIP capacitor cannot be simultaneously used, although the capacitor may be formed using the PIP. Consequently, the capacity of the capacitor is excessively limited.

SUMMARY

Embodiments relate to a semiconductor device capacitor fabrication method that can enable the simultaneous use of an oxide capacitor and a PIP capacitor of a semiconductor device depending upon whether metal line terminals are used, thereby maximizing the capacitance of the capacitor.

Embodiments relate to a semiconductor device capacitor fabrication method that can include at least one of the following steps: forming an active region, a P-well and at least one shallow trench isolation region in a semiconductor substrate; forming a first gate electrode over the semiconductor substrate; forming a first photoresist pattern over the first gate electrode; depositing a silicon nitride layer partially over the photoresist pattern; forming a second gate electrode over the silicon nitride layer; sequentially forming a first insulation layer and a second insulation layer over the semiconductor substrate; forming a second photoresist pattern over the second insulation layer; forming a plurality of holes extending through the first insulating layer and the second insulating layer; and then completing the formation of a semiconductor device by forming line terminals for a transistor and a capacitor by filling the holes with a metal material.

Embodiments relate to a semiconductor device capacitor fabrication method that can include at least one of the following steps: providing a semiconductor substrate having an active region and at least one shallow trench isolation region; forming a first gate electrode over the semiconductor substrate; forming a nitride layer partially over the first gate electrode; forming a second gate electrode over the nitride layer; forming a first insulation layer over the semiconductor substrate including the first gate electrode and the second gate electrode; forming a second insulation layer over the semiconductor substrate including the first insulating layer; and then forming a plurality of line terminals extending through the first insulating layer and the second insulating layer and in contact with the active region, the semiconductor substrate, the first gate electrode and the second gate electrode.

Embodiments relate to a semiconductor device that can include at least one of the following: a semiconductor substrate having an active region, a P-well and a pair of shallow trench isolation regions; a first gate electrode formed over the semiconductor substrate; a nitride layer formed partially over the first gate electrode; a second gate electrode formed over the nitride layer; a first insulation layer formed over the semiconductor substrate including the first gate electrode and the second gate electrode; second insulation layer formed over the semiconductor substrate including the first insulating layer; and a plurality of line terminals extending through the first insulating layer and the second insulating layer and in contact with the active region, the P-well, the first gate electrode and the second gate electrode.

DRAWINGS

Example

Example

Example

DESCRIPTION

In accordance with embodiments, active area 201 and first gate electrode 203 can be formed on and/or over a P-well type semiconductor substrate having devices separated from each other by STI layers. Silicon nitride (SiN) layer 205, on and/or over which a capacitor can be formed, can then be partially deposited on and/or over first gate electrode 203. Subsequently, second gate electrode 207 can be formed on and/or over silicon nitride layer 205.

First insulation layer 209 can then be deposited over the semiconductor substrate and then planarized through a CMP process. Subsequently, second insulation layer 211 can then be deposited on and/or over first insulation layer 209. Second insulation layer 211 can then be planarized through a CMP process. Accordingly, first insulation layer 209 and second insulation layer 211 are sequentially formed.

An exposure process and a development process using a reticle designed in a predetermined target pattern can then be carried out on second insulation layer 211 to selectively remove a portion of photoresist (PR) entirely deposited on and/or over second insulation layer 211. Accordingly, a PR pattern for defining a metal line area is formed on and/or over second insulation layer 211.

The resultant structure can then be etched through a photolithographic process using the formed PR pattern as a mask, to form holes 213 through which the respective uppermost surfaces of the P-well type semiconductor substrate, active (source and drain) region 201, first gate electrode 203, and second gate electrode 207 can be exposed.

Finally, holes 213 can then be filled with metal 215 to form line terminals for the transistor and the capacitor, such as a source line terminal, a drain line terminal, first and second input line terminals, and a ground line terminal.

Figure 2A:
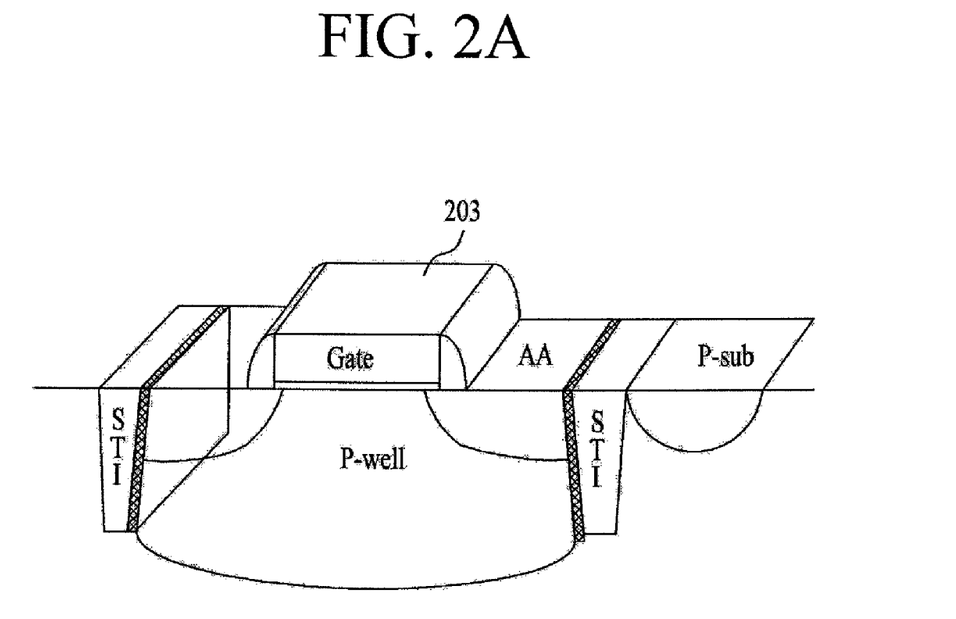
FIGS. 2A to 2F illustrate a semiconductor device capacitor fabrication method, in accordance with embodiments.

As illustrated in example FIG. 2A, a semiconductor device capacitor fabrication method in accordance with embodiments can include forming active area 201 and first gate electrode 203 on and/or over a P-well type semiconductor substrate having devices separated from each other by STI layers.

Figure 2B:
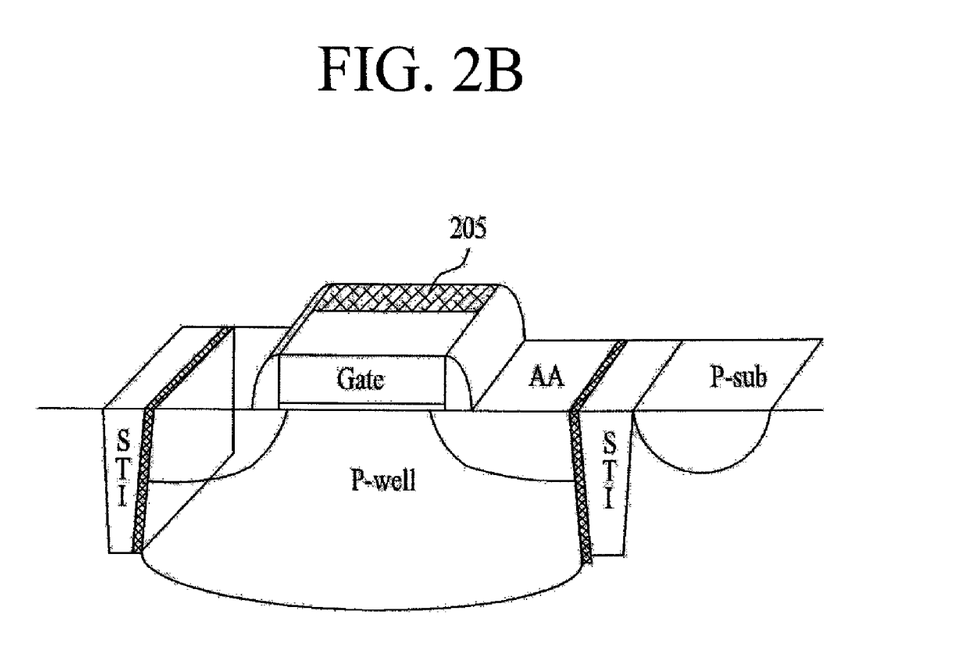

As illustrated in example FIG. 2B, silicon nitride (SiN) layer 205, on which a capacitor will be formed, can then be partially deposited on and/or over first gate electrode 203, especially on and/or over the top of a pattern having first gate electrode 203 formed thereon and/or thereover.

Figure 2C:
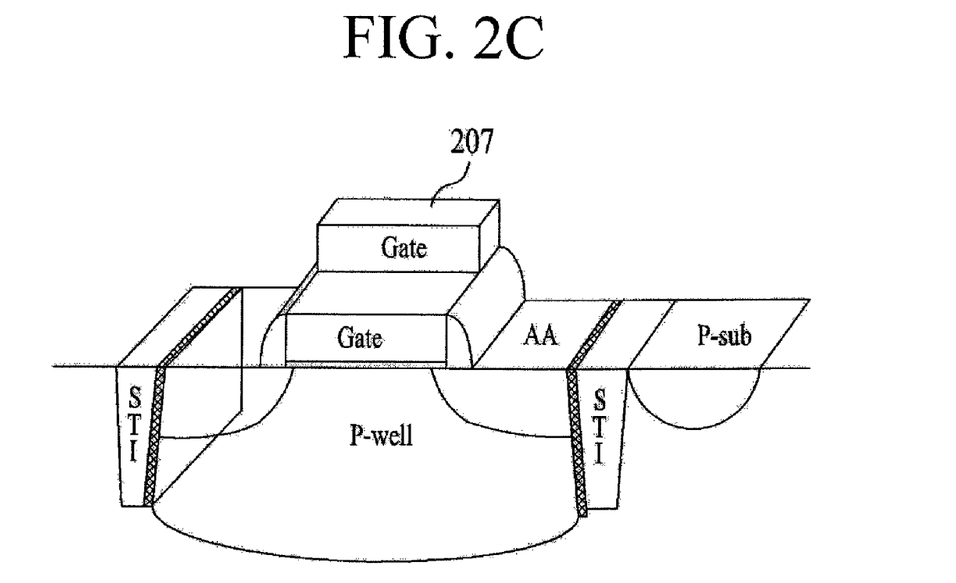

As illustrated in example FIG. 2C, second gate electrode 207 can then be formed on and/or over silicon nitride (SiN) layer 205.

Figure 2D:
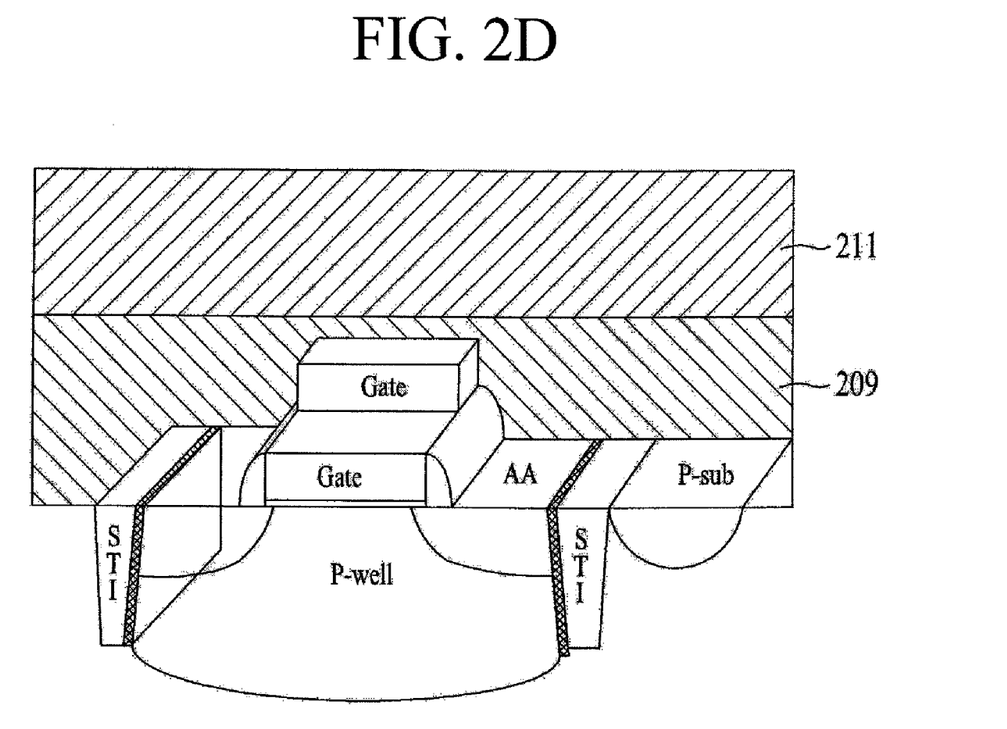

As illustrated in example FIG. 2D, first insulation layer 209 can then be deposited on and/or over the semiconductor substrate including active area 201, first gate electrode 203, silicon nitride (SiN) 205 and second gate electrode 207. First insulating layer 209 can then be planarized through a CMP process. Second insulation layer 211 can then be deposited on and/or over first insulation layer 209 and then planarized through a CMP process. In this way, first insulation layer 209 and second insulation layer 211 can be sequentially formed.

Figure 2E:
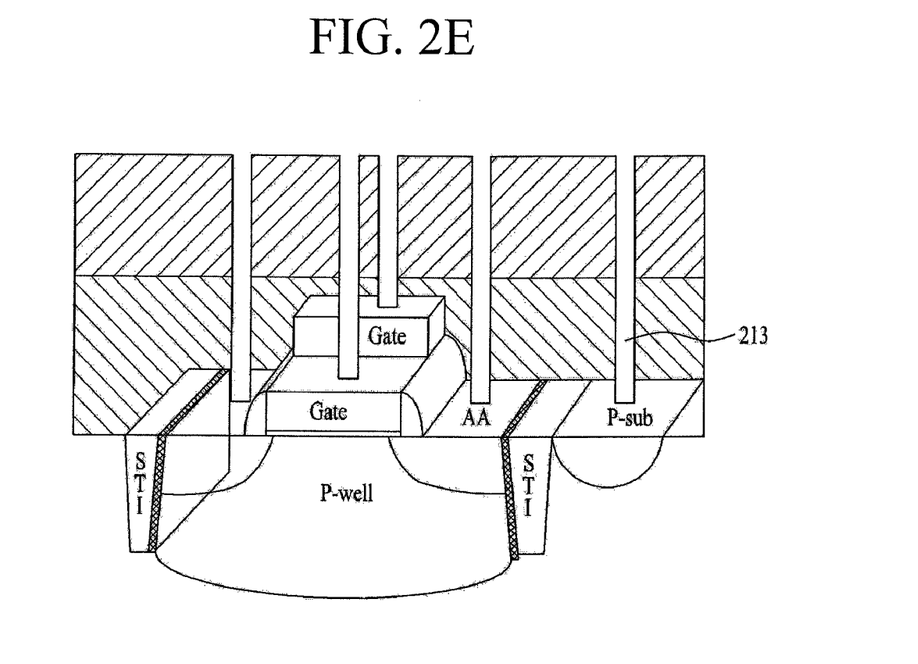

As illustrated in example FIG. 2E, an exposure process and a development process using a reticle designed in a predetermined target pattern can then be carried out on second insulation layer 211 to selectively remove a portion of PR entirely deposited on and/or over second insulation layer 211 such that a PR pattern for defining a metal line area can be formed thereon and/or thereover. The structure can then be etched through a photolithographic process using the formed PR pattern as a mask to form holes 213 to expose the uppermost surface of the P-well type substrate, active (source and drain) area 201, first gate electrode 203, and second gate electrode 207.

Figure 2F:
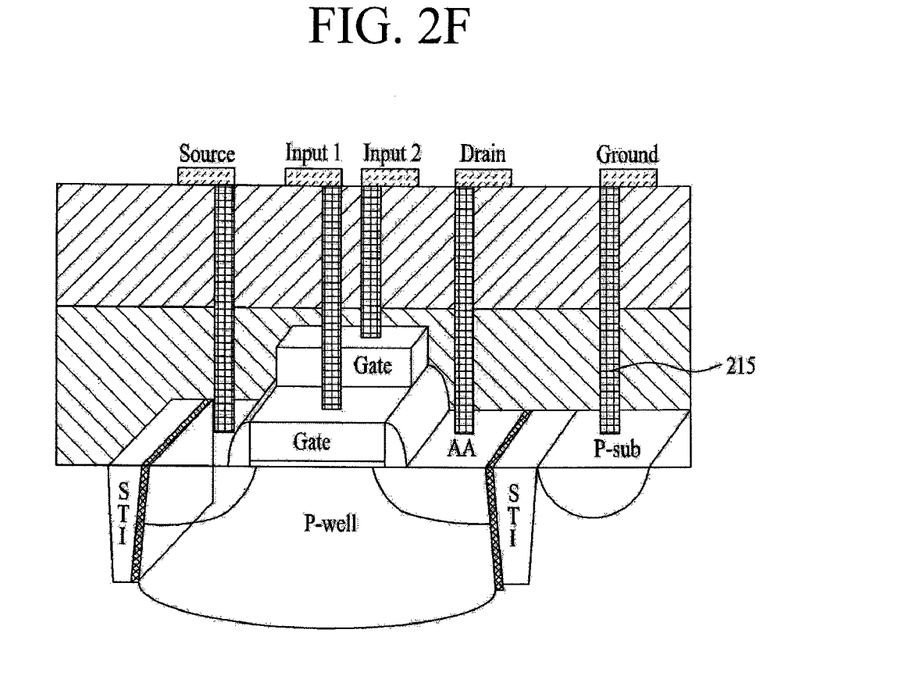

As illustrated in example FIG. 2F, the holes 213 can then be filled with metal 215 to form line terminals for the transistor and the capacitor, such as a source line terminal, a drain line terminal, first and second input line terminals, and a ground line terminal.

Particularly, the source line terminal and the drain line terminal can be formed by filling holes 213 which expose the uppermost surface of active region 201 with metal 215. The first input line terminal can be formed by filling holes 213 which expose the uppermost surface of first gate electrode 203 with metal 215. The second input line terminal can be formed by filling holes 213 which expose the uppermost surface of second gate electrode 207 with metal 215. The ground line terminal can be formed by filling holes 213 which expose the uppermost surface of the P-well type substrate with metal 215.

Figure 3:
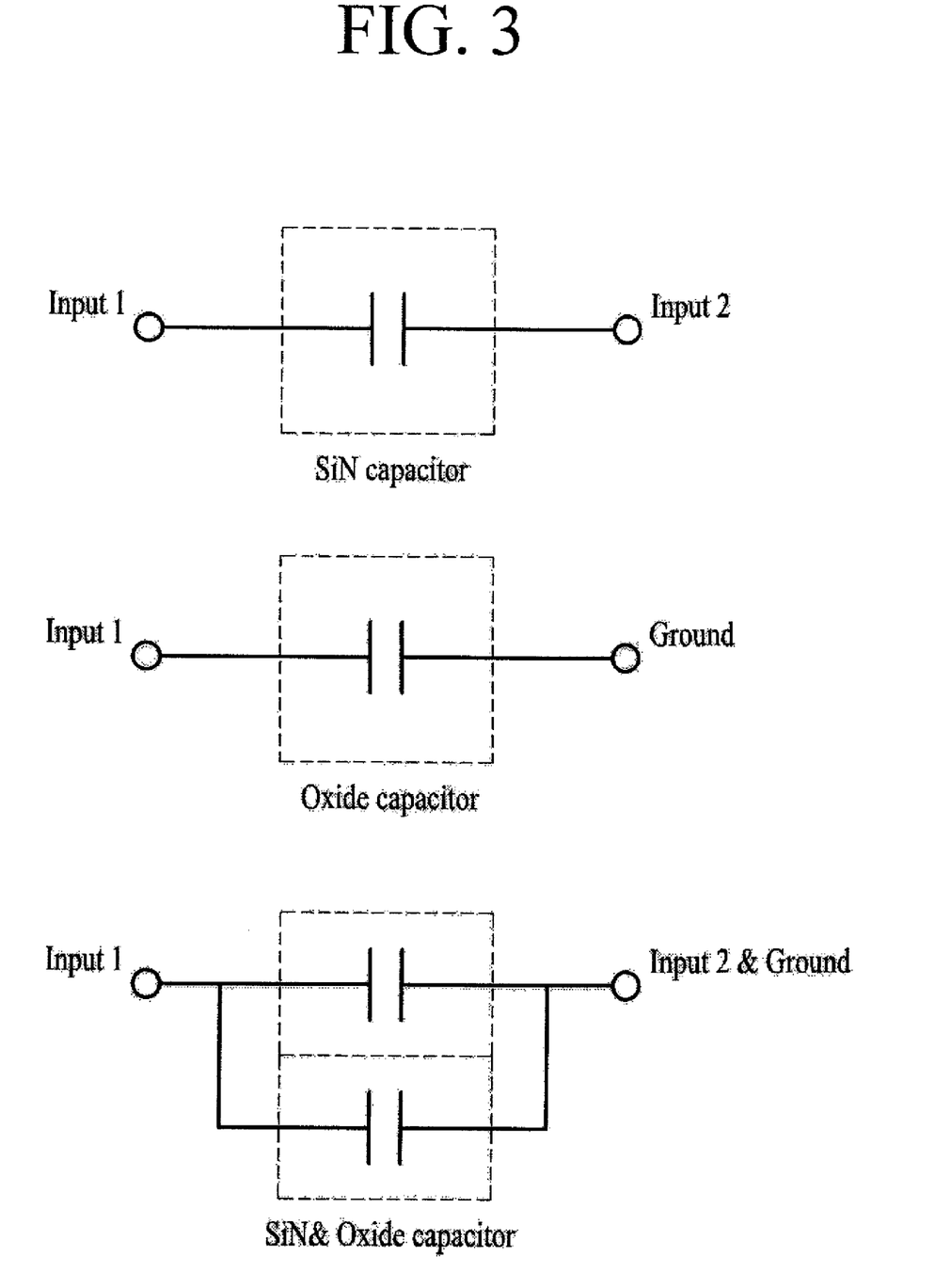
FIG. 3 illustrates capacitors fabricated in accordance with embodiments.

As illustrated in example FIG. 3, consequently, when the first input line terminal and the second input line terminal are used, the semiconductor device may be used as a silicon nitride (SiN) capacitor for the PIP capacitor. When the first input line terminal and the ground line terminal are used, the semiconductor device may be used as an oxide capacitor, which the transistor originally includes. Moreover, when the first input line terminal, the second input line terminal, and the ground line terminal are jointly used, it is possible to use both the SiN capacitor and the oxide capacitor, which are connected in parallel with each other, whereby the capacitance of the capacitor is greatly increased. When only the use of the transistor is required, on the other hand, it is sufficient to exclude the second input line terminal. In this case, the semiconductor device in accordance with embodiments can be used as a normal semiconductor device. Consequently, the semiconductor device fabricated in accordance with embodiments can solve the problem of the inability to simultaneously an oxide capacitor and a PIP capacitor.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   forming an active region, a P-well and at least one shallow trench isolation region in a semiconductor substrate;
   forming a first gate electrode over the semiconductor substrate;
   forming a first photoresist pattern over the first gate electrode;
   depositing a silicon nitride layer partially over the photoresist pattern;
   forming a second gate electrode over the silicon nitride layer;
   sequentially forming a first insulation layer and a second insulation layer over the semiconductor substrate;
   forming a second photoresist pattern over the second insulation layer;
   forming a plurality of holes extending through the first insulating layer and the second insulating layer; and then
   completing the formation of a semiconductor device by forming line terminals for a transistor and a capacitor by filling the holes with a metal material.

2. The method of claim 1, wherein the line terminals include a source line terminal, a drain line terminal, a first input line terminal, a second input line terminal, and a ground line terminal.

3. The method of claim 2, wherein the semiconductor device comprises a silicon nitride capacitor for a PIP capacitor when the first input line terminal and the second input line terminal are used.

4. The method of claim 2, wherein the semiconductor device comprises an oxide capacitor for a transistor when the first input line terminal and the ground line terminal are used.

5. The method of claim 2, wherein the semiconductor device comprises a silicon nitride capacitor and an oxide capacitor which are connected in parallel with each other when the first input line terminal, the second input line terminal, and the ground line terminal are jointly used.

6. The method of claim 2, wherein the semiconductor device comprises a transistor when the first input line terminal, the ground line terminal, the source line terminal, and the drain line terminal are jointly used.

7. The method of claim 2, wherein the source line terminal and the drain line terminal are formed by filling the holes exposing the uppermost surface of the active region with a metal material.

8. The method of claim 2, wherein the first input line terminal is formed by filling the holes exposing the uppermost surface of the first gate electrode with a metal material.

9. The method of claim 2, wherein the second input line terminal is formed by filling the holes exposing the uppermost surface of the second gate electrode with a metal material.

10. The method of claim 2, wherein the ground line terminal is formed by filling the holes exposing the uppermost surface of the P-well of the semiconductor substrate with a metal material.

11. A method comprising:
   providing a semiconductor substrate having an active region and at least one shallow trench isolation region;

forming a first gate electrode over the semiconductor substrate;

forming a nitride layer partially over the first gate electrode;

forming a second gate electrode over the nitride layer;

forming a first insulation layer over the semiconductor substrate including the first gate electrode and the second gate electrode;

forming a second insulation layer over the semiconductor substrate including the first insulating layer; and then forming a plurality of line terminals extending through the first insulation layer and the second insulation layer and in contact with the active region, the semiconductor substrate, the first gate electrode and the second gate electrode.

12. The method of claim 11, wherein the line terminals include a source line terminal, a drain line terminal, a first input line terminal, a second input line terminal, and a ground line terminal.

13. The method of claim 11, wherein the nitride layer comprises a silicon nitride layer.

14. The method of claim 11, wherein the semiconductor substrate comprises a P-well type semiconductor substrate.

15. The method of claim 11, further comprising, after forming the first insulation layer and before forming the second insulation layer, planarizing the uppermost surface of the first insulation layer.

16. The method of claim 15, further comprising, after forming the second insulation layer and before forming the plurality of line terminals, planarizing the uppermost surface of the second insulation layer.

17. The method of clam 11, wherein forming plurality of line terminals comprises:

forming a plurality of holes extending through the first insulation layer and the second insulation layer to expose the uppermost surface of the semiconductor substrate, the active region, the first gate electrode, and the second gate electrode; and then filling the plurality of holes with a metal material.

* * * * *